United States Patent [19]

Pernyeszi et al.

[11] Patent Number: 5,031,017
[45] Date of Patent: Jul. 9, 1991

[54] COMPOSITE OPTICAL SHIELDING

[75] Inventors: Joseph Pernyeszi, Scotts Valley; Michael D. Walters, San Jose, both of Calif.; Kevin Venor, Ft. Collins, Colo.

[73] Assignee: Hewlett-Packard Company, Palo Alto, Calif.

[21] Appl. No.: 149,766

[22] Filed: Jan. 29, 1988

[51] Int. Cl.[5] .............................................. H01L 27/02
[52] U.S. Cl. .................................... 357/41; 357/30; 357/52; 357/54; 357/84
[58] Field of Search .................. 428/518, 480, 111.3; 528/295.5, 349, 211; 357/41, 34, 54, 30 L, 84, 80, 81, 67, 72, 30 P, 30 G, 30 D, 52 C, 52 E

[56] References Cited

U.S. PATENT DOCUMENTS

| | | | |
|---|---|---|---|
| 3,925,081 | 12/1975 | Chiklis | 428/480 |
| 3,925,801 | 12/1975 | Haitz et al. | 357/17 |
| 3,969,751 | 7/1976 | Drukaroff et al. | 357/54 X |
| 4,320,174 | 3/1982 | Rabinovitch et al. | 428/518 |
| 4,771,088 | 9/1988 | Pekarik | 528/111.3 |
| 4,803,543 | 2/1989 | Inayoshi et al. | 357/72 |
| 4,933,744 | 6/1990 | Segawa et al. | 357/72 |

Primary Examiner—William Mintel
Assistant Examiner—R. Potter

[57] ABSTRACT

An opaque shield is provided for integrated circuits and comprises reflective particles of titanium dioxide and light-absorbing particles of carbon black suspended in polyimide. The reflective particles increase the effective path length of light traversing the carrier so that a much lower concentration of carbon black is required to render the shield opaque. The concentration of carbon black can be low enough so that its conductivity does not impair operation of the integrated circuit. In addition to shielding the integrated circuit from light, the shield also protects the integrated circuit from contamination. A fluid precursor material is formed by mixing titanium dioxide and carbon black particles into a polyamic acid solution. This solution is diluted, filtered and vacuum distilled to yield a suspension free of over-sized particles. The resulting suspension can be applied and patterned using conventional semiconductor processing techniques. As a result, an integrated circuit can be completely or selectively shielded as desired.

15 Claims, 4 Drawing Sheets

COMPOSITE OPTICAL SHIELDING

BACKGROUND OF THE INVENTION

The present invention relates to light shielding and, more particularly, to a structure and method for shielding integrated circuit elements from light. A major objective of the present invention is to provide shielding which selectively admits light for activating predetermined circuit elements in an integrated circuit while prohibiting light from disturbing other elements in the integrated circuit.

Hybrid devices are available which take advantage of strengths of both electrical and optical technologies. For example, optical couplers can be used to couple two electrical circuits which operate at very different voltages without the danger of a device breakdown due to large potential differences. Serendipitously, semiconductors like silicon, which provide the most sophisticated of electronic circuits, are also optically active. Thus, for example, a single integrated circuit can include elements acting as photo-detectors and other elements dedicated to electronically processing photo-detections to provide electrical outputs. A single integrated circuit can be used to develop a control signal based on a pattern detected by integrated optical detectors.

The ability of semiconductor elements to respond to both optical and electrical inputs is problematic in that the operation of circuit elements intended to respond only to electrical inputs can be affected by incident light. In circuits designed for electrical inputs, outputs and processing only, this problem can be addressed by enclosing an integrated circuit in a light-tight package. However, hybrid devices must provide light access to photo-detector elements while excluding light from other circuit elements. Standard integrated circuit packages are not well-adapted to allowing light to reach certain areas of an integrated circuit while excluding it from others.

Ideally, an opaque material would be patterned directly on an integrated circuit to admit and exclude light over respectively appropriate areas. Preferably, the material would be opaque over a broad frequency range, including both infrared and visible light wavelengths. As a minimum requirement, the material should be opaque relative to the wavelengths to be detected by the photo-detector elements. Other wavelengths could be excluded by packaging or other means.

Carbon black is a pre-eminent light absorbing material, absorbing a high percentage of incident light over a broad frequency range. It can be obtained in highly pure form and can be applied over a semiconductor surface by a number of different methods. The problem with carbon black is that it is conductive and can short or otherwise interfere with circuit functions, even when applied over a conventional insulating passivation layer.

There are non-conductive light-absorbing materials, such as magnetite, but it is difficult and expensive to obtain them with the purity required for compatibility with integrated circuits. Contaminated materials introduce impurities into the integrated circuit which can impair circuit functioning.

Furthermore, it is preferable that the method used to apply and pattern a chosen opaque coating be compatible with standard semiconductor processing techniques and equipment. Very different processing would likely be costly in terms of training and equipment. Heretofore, there has been no material compatible with the electrical, optical and processing requirements discussed above.

SUMMARY OF THE INVENTION

An optical shield can be provided using a material with reflective particles distributed through a carrier which also includes some light-absorbing ability. The light-absorbing ability can be integral to the carrier or the reflective particles. However, it is most readily provided by distributing dedicated light-absorbing particles. The light-absorbing particles can be carbon black.

The concentration of carbon black particles can be made small enough to minimize the potential negative impact of their conductivity, especially as they are embedded in a highly insulating carrier material such as polyimide. Another insulating material, titanium dioxide, can be used for the reflective particles. The resulting sparsity of light-absorbing material is compensated by the longer path lengths of light through the material due to the action of the reflective particles. Thus the inventive material is, in the aggregate, light-absorbing, non-conductive and contaminant free.

This optical-shield material can be prepared as a suspension of reflective particles in polyamic acid solution, with carbon black serving as the preferred light-absorber. More generally, a prepolymer carrier can be used where the solidified carrier is to be a polymer. This liquid suspension can be spun onto an integrated circuit in essentially the manner photo-resist is conventionally applied to an integrated circuit in a masking and patterning procedure. After solvent is removed, the coating can be patterned using conventional photo-resist and masking procedures. The optical shield material can be removed, for example, over areas of an integrated circuit used as optical inputs and contacts for wire-bonding. Thus, procedures compatible with conventional semiconductor processing are available for applying and patterning the optical shield material.

One problem that can arise in patterning a suspension is that photo-resist can fail to conform to a surface made irregular by relatively large particles. Once the photo-resist is patterned, etchant may seep under hardened photo-resist and etch the optical shield over unintended areas. This problem can be mitigated by controlling the maximum particle size in the suspension. The polyamic acid solution used as the precursor carrier can be too viscous to filter out large particles using, for example, filter paper. Additional solvent can be used to thin the carrier sufficiently for the necessary filtering to be performed. The excess solvent can be removed at low temperature using vacuum distillation so that premature curing is avoided. The optical shield precursor so prepared is compatible with conventional photo-resist patterning procedures.

Relative concentrations and other parameters of interest are dependent on the specific material employed and the application at hand. The variables of interest are addressed below in the context of a patterned optical shield for semiconductor integrated circuits. However, the present invention can be employed in other contexts in which one or more of the properties of a non-conductive, light-absorbing, contaminant-free and semiconductor-processing-compatible material are required. These and other features and advantages of the present inven-

DESCRIPTION OF THE PREFERRED EMBODIMENTS

Figure 1:
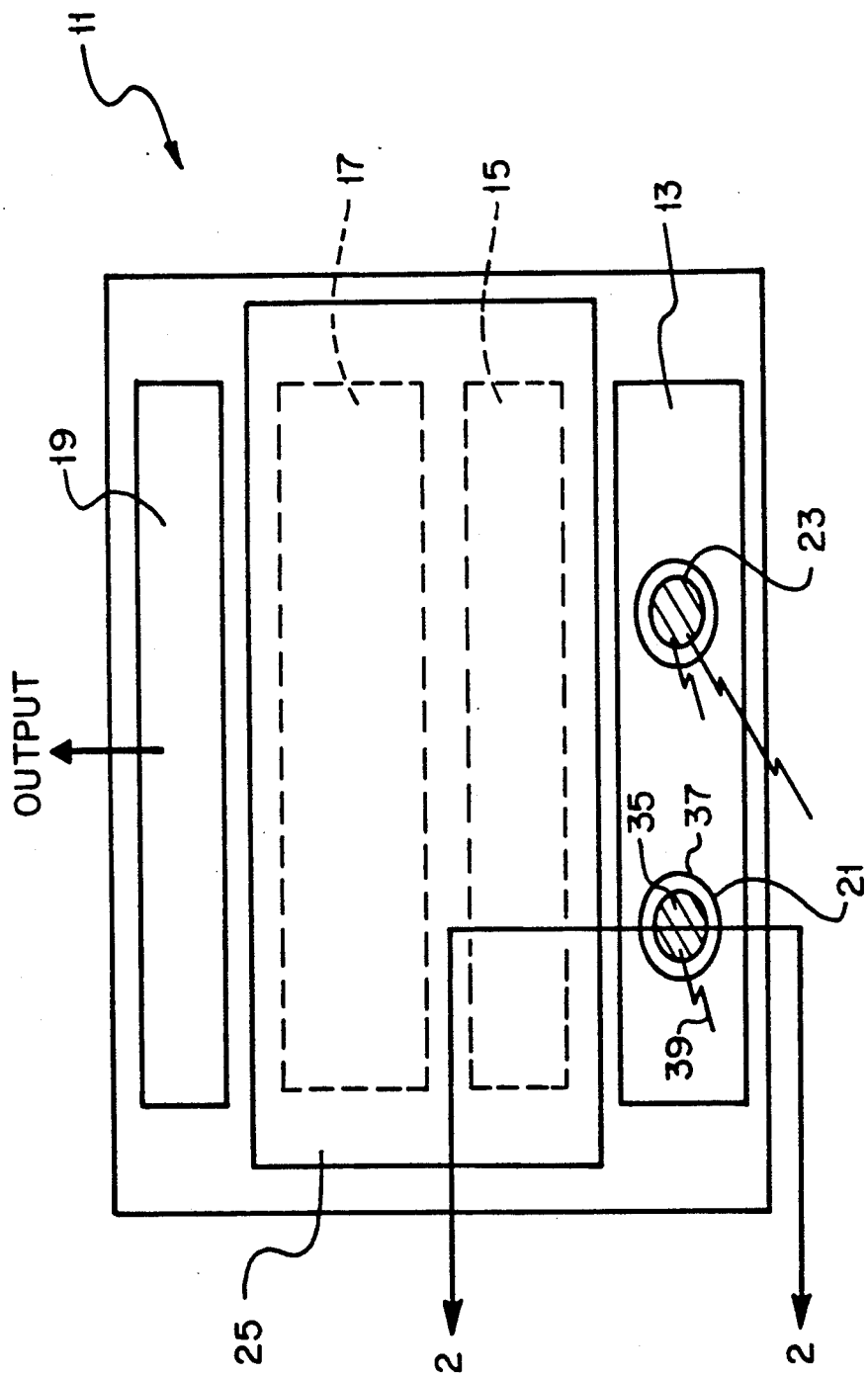
FIG. 1 is a plan view of an integrated circuit with an opaque shield in accordance with the present invention.

An integrated circuit 11 includes a photo-detector area 13, an amplification area 15, a logic area 17 and an output area 19, as shown in FIG. 1. The photo-detector area 13 has two photo-diodes 21 and 23 which generate electrical signals in response to incident light. The amplification area 15 includes amplification circuitry to amplify signals generated by photo-diodes 21 and 23 so they are sufficiently strong to drive a NAND gate in logic area 17. The NAND gate goes active low only when both photo-diodes are activated so that a spurious triggering of one of the photo-diodes is not interpreted as a detection. The output of the NAND gate is converted to an appropriate form for transmittal elsewhere in an incorporated system by buffers and other circuitry in output area 19.

In accordance with the present invention, light is blocked from selected areas, i.e., amplification area 15 and logic area 17, by an opaque shield 25. Photo-detector area 13 is not shielded so that light can activate photo-diodes 21 and 23. Without shielding, circuitry in amplification area 15 could be activated directly by light. Depending on the incorporating system and environment, a false detection could occur or circuit operation could be otherwise unpredictably impaired. Shield 25 ensures that the only signal input to amplification area 15 is the detection outputs of photo-diodes 21 and 23.

Logic area 17 is shielded for similar reasons. The inputs to logic area 17 are amplified in amplification area 15. For this reason, the circuit elements of logic area 17 need not be as sensitive as those of amplification area 15 and are accordingly less vulnerable to light activation and other forms of interference. Nonetheless, shield 25 provides significant improvement in the noise performance of logic area 17. Output area 19 includes bonding pads which are left covered for access by interfacing wires.

Figure 2:
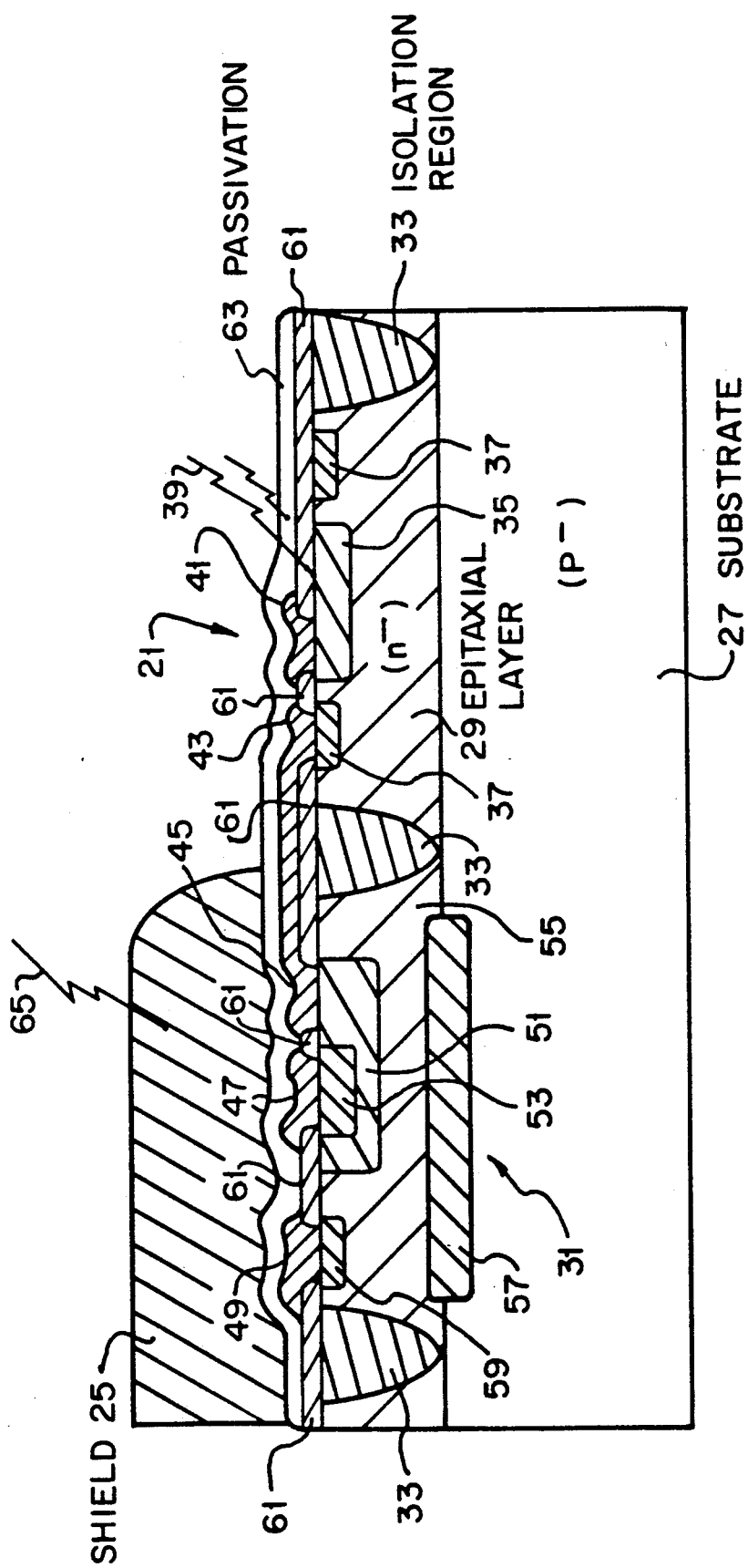
FIG. 2 is an enlarged sectional view taken along line 2—2 of FIG. 1.

The function of shield 25 is further explained with reference to FIG. 2. Integrated circuit 11 is fabricated on a p-type substrate 27, i.e., one in which electron holes are majority carriers. Substrate 27 is covered by a lightly-doped n-type epitaxial layer 29, i.e., one in which electrons are the majority carriers. Photo-diode 21 and a transistor 31 (of amplification area 15 of FIG. 1) are shown in FIG. 2, bounded by p-type isolation regions 33. Shield 25 is shown extending over transistor 31 but not over photo-diode 21.

Photo-diode 21 includes a p-type center 35 forming a diode junction with an n-type ring 37, as indicated in both FIGS. 1 and 22. Current flows across this junction when light, indicated by bolt 39, strikes photo-diode 21. The potential difference required for this current flow is applied at a center contact 41 and a perimeter contact 43, shown in FIG. 2. Perimeter contact 43 is electrically coupled to a base contact 45 of transistor 31. A potential difference is applied across transistor 31 via an emitter contact 47 and a collector contact 49. When light activates photo-diode 21, the current to the base contact 45 flows into a base 51 of transistor 31, stimulating current from emitter contact 47, through an emitter 53, base 51, emitter drift region 55 of epitaxial layer 29, a buried collector 57, a collector insert 59, and collector contact 49, as is well known in the bi-polar transistor art.

As is apparent to those skilled in the art, substrate 27 and isolation regions 33 are p-type; diode center 35 is heavily doped p-type. Base 51 is heavily doped p-type beneath emitter 53 and moderately doped p-type at the sides of emitter 53. Epitaxial layer 29 is lightly doped n-type, while diode ring 37, emitter 53 and diode ring 37 are heavily doped n-type. Contacts 41,43,45,47 and 49, as well as the coupling between perimeter contact 43 and base contact 45 are formed in a single masking step in an aluminum layer. Electrical isolation of the contacts is provided by silicon dioxide 61 patterned in a previous masking step. Passivation 63 is applied over the entire wafer. Passivation 63 includes a lower silicon dioxide layer and an upper silicon nitride layer to minimize exposure due to pinholes. Substrate 27 can be about 0.2 mm thick, epitaxial layer 29 can be about 10 $\mu$m, thick, the passivation layer 63 can be about 0.5 $\mu$m thick, while shield 25 can be about 13–15 $\mu$m thick.

In accordance with the present invention, shield 25 covers transistor 31, while photo-diode 21 is exposed to light. Thus, light, indicated by bolt 65, is prevented from activating transistor 31. Accordingly, the probability of transistor 31 being activated other than by an electrical signal from photo-diode 21 is minimized.

Figure 3:
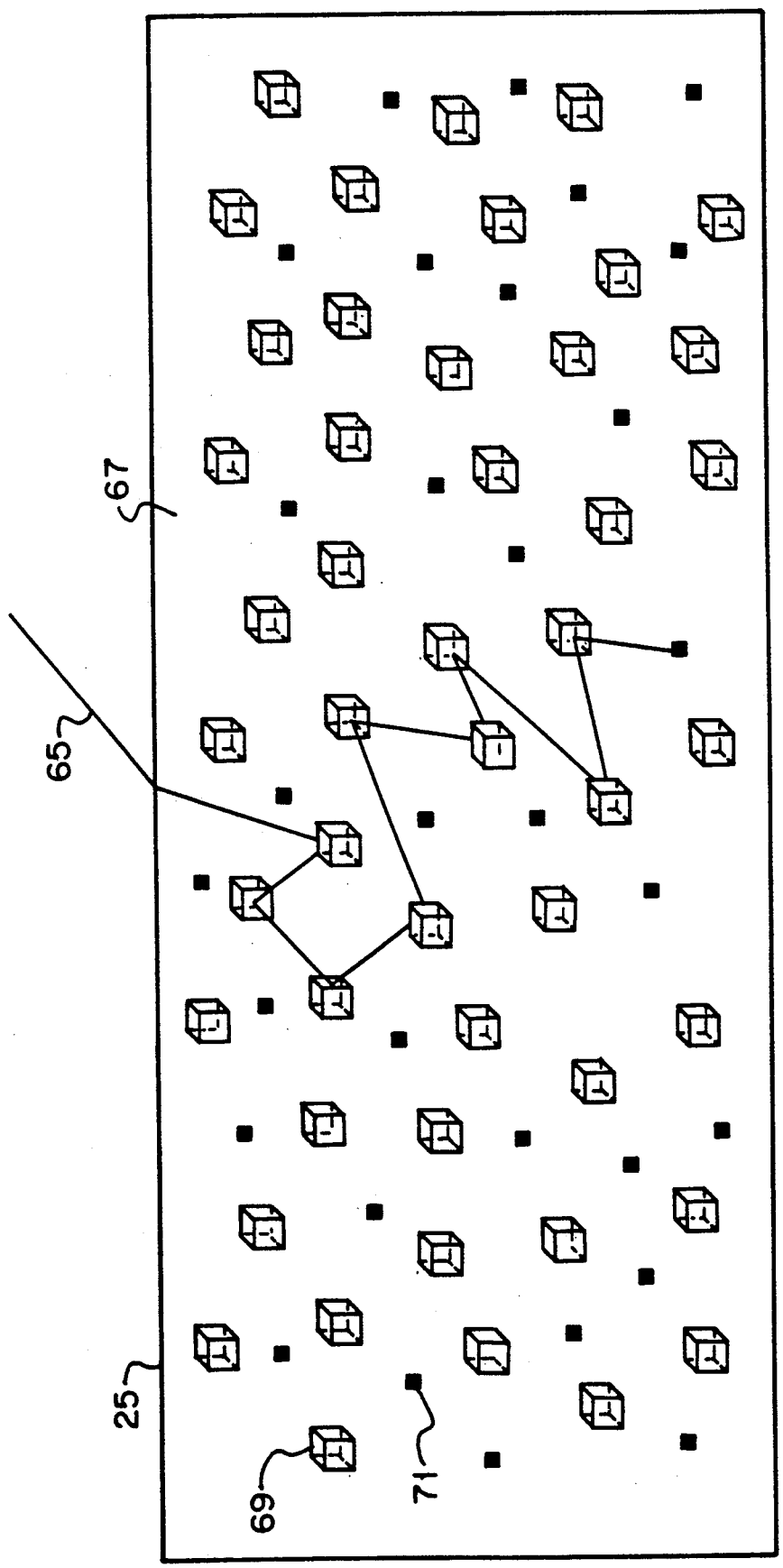
FIG. 3 is a sectional view of a layer of opaque shield material used in the integrated circuit of FIG. 1.

The structure and effectiveness of shield 25 is explained with reference to FIG. 3. Shield 25 is a solid suspension in which polyimide 67 serves as the carrier for particles of titanium dioxide 69 and carbon black 71. Polyimide is a very good insulator and barrier to contamination, and so serves two important functions in protecting integrated circuit 11. Carbon black 71 serves as light-absorbing material. The concentration of carbon black 71 is sufficiently low that its conductivity is not a problem. On the other hand, the concentration of carbon black 71 is not sufficient to block light to the extent required by integrated circuit 11, FIG. 1.

Titanium dioxide 69 functions primarily as reflective material in shield 25. Titanium dioxide 69 causes light 65 to reflect back and forth within polyimide 67, effectively lengthening the path light must travel to get through shield 25. This path lengthening increases the opportunity for light to contact and be absorbed by particles of carbon black 71. Thus, an amount of carbon black insufficient in itself to block a high percentage of light from passing through, can render shield 25 opaque due to the cooperation of the particles of titanium dioxide 69.

In addition to enhancing the effectiveness of carbon black 71, titanium dioxide 69 acts as filler material for polyimide 67. As described below, polyimide is formed through the polymerization of polyamic acid. Shrinkage during polymerization of shield 25 can stress the underlying integrated circuit structure, adversely affecting its reliability. The tendency to shrink is largely abated by the presence of a substantial amount of filler. Thus, titanium dioxide 69 enhances the performance of carbon black 71 while minimizing stress-induced adverse effects of polyimide 67.

The relative composition of shield 25 is about 100:40:10 by weight of polyimide to titanium dioxide to carbon black. The concentration of carbon black is bounded from above the requirement that shield 25 be an effective insulator. The concentration of carbon black is bounded below by the requirement that some light-absorbing ability be provided. A suitable range of carbon black between 2% and 10% by weight of the precursor suspension, not including the solvent.

The concentration of titanium dioxide is bounded from below by the requirement of providing sufficient reflectivity to ensure that substantially all light entering shield 25 is absorbed by carbon black particles rather than passing though shield 25. The concentration of titanium dioxide is bounded from above by the need to maintain some structural integrity in the polyimide; too much titanium dioxide results in cracking of the polyimide material. The concentration of titanium dioxide can range from 10%-80%, but is preferably 20% and 60% by weight of the precursor suspension, not including solvent.

The particle size of the titanium dioxide is bounded from below by the requirement that the particles be reflective. This requirement corresponds to a dimensional requirement of about $\frac{1}{4}$ the wavelength of the shortest wavelength of interest. Practically, particles of at least 0.1 $\mu$m are needed for broadband light-absorption. No comparable requirement applies to the carbon black, which can comprise particles on the order of 0.01 $\mu$m. Particle sizes are bounded from above, depending on application, by the need for a smooth surface. For the shield material to be patterned using conventional photo-lithography, a maximum particle size of 2 $\mu$m for both carbon black and titanium dioxide assures that photo-resist can conform to the shield surface during a patterning procedure.

Figure 4:
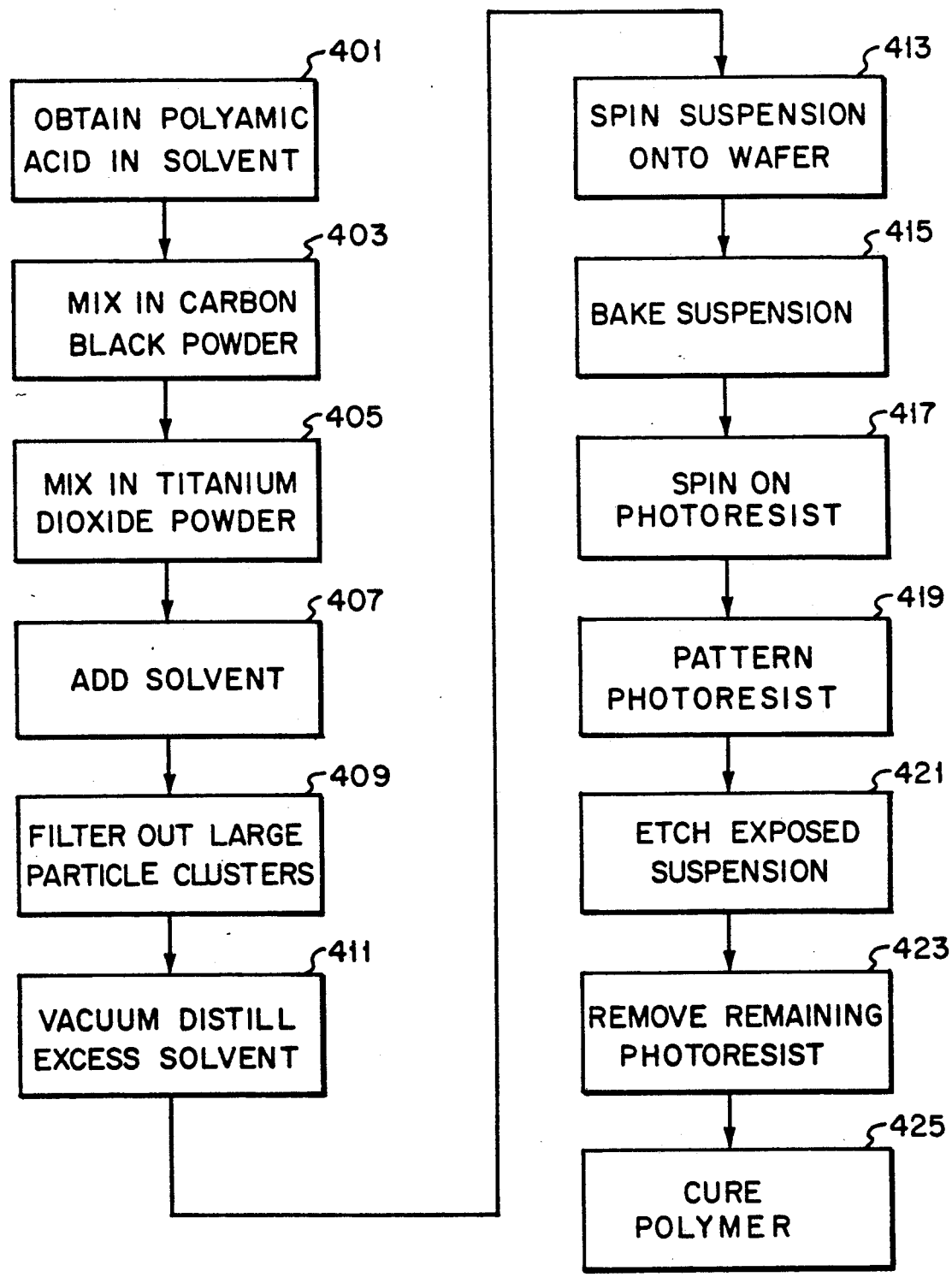
FIG. 4 constitutes a flow chart of a method of fabricating the integrated circuit of FIG. 1 in accordance with the present invention.

The shielding for integrated circuit 11 of FIG. 1 can be provided as described hereinbelow with reference to FIGS. 4A and 4B. FIG. 4A indicates the steps through the preparation of the pre-cursor suspension used to form shield 25. FIG. 4B indicates the steps used to from shield 25 using the pre-cursor suspension.

As indicated at 401 in FIG. 4A, the first step is to obtain polyamic acid in solution. Polyamic acid polymerizes to form polyimide. Solvent is required to lower the viscosity of polyamic acid to facilitate the suspension of carbon black and titanium dioxide particles. A 14% solution of polyamic acid i n-methyl pyrrolidone provides a suitably viscous fluid for mixing.

In mixing carbon black powder with the polyamic acid solution, as required for step 403, the challenge is to wet individual carbon black particles with the fluid. The small carbon black particles tend to cluster and resist wetting. A typical ball mill, such as those used to mix paints and other suspension can be employed to obtain the desired mixture of carbon black particles in the polyamic acid solution. A ball mill comprises a roller bed, a porcelain cylindrical container which can be rotated by the roller, and a large number of porcelain balls which are tossed within the container as it is rotated. Polyamic acid solution and carbon black particles are placed in the container with the porcelain balls. As the container is rotated, the balls crash into each other, imposing considerable pressure on any fluid and particles caught at the point of contact. This pressure is sufficient to wet the carbon black particles so that the suspension can be formed. This step is continued until the suspension of carbon black particles in the polyamic acid solution is substantially complete.

In the step indicated at 405, a three roller mill is used to mix titanium dioxide particles in to the polyamic acid, now including carbon black particles. Titanium dioxide can be obtained readily in particle sizes of about 0.5 to 0.6 $\mu$m. As known in the paint mixing and related arts, a typical three roller mill includes three side-by-side rollers. The first and second rollers spin in opposite directions and at different speeds, e.g., the first roller at 80 revolutions per minute (rpm) and the second roller at 30 rpm, so that their cylindrical surfaces rub against each other. As polyamic acid solution and titanium dioxide particles are introduced together between the first and second rollers, the rubbing actions forces some of the titanium dioxide particles into suspension. Some of the fluid recycles by adhering to the second roller for a 360 turn, while other fluid separates where the second and third rollers meet to adhere to the third roller. A stainless steel skirt scrapes fluid from the third roller and leads it into a container. Fluid reaching the container can be recycled as many times as needed until the desired suspension of titanium oxide in polyamic acid solution is achieved.

At this point, the suspension has the desired optical properties for the shield. However, some of the particles in the suspension could be big enough to interfere with patterning using conventional photo-lithographic techniques. Photo-resist may not conform properly to large particles residing at the surface of the suspension; as a result, etchant may seep under developed photo-resist and remove shield material intended to be protected. It is desirable to remove particles with diameters greater than 2 $\mu$m. The main source of large particles is clustered carbon black that failed to break up in the ball mill procedure.

The oversized particles can be removed by filtering, but additional solvent must be added to permit thermal agitation to aid in the filtering process, as indicated at step 407. The additional solvent is added to constitute 85% by weight of the diluted suspension. The additional solvent should be added drop by drop at first and slowly stirred in so that the particles do not come out of suspension. As the added solvent is fully dissolved into the suspension, additional solvent can be added at an increasing rate.

In step 409, the dilute suspension is poured through a Buchner funnel, at first with gross filter paper, e.g., 50 $\mu$m pore size to remove the largest particles. Then, fine filter paper, e.g., 2.7 $\mu$m pore size, is used. Several sheets of filter paper may be required to completely filter a batch of dilute suspension. After the complete batch is filtered once, a clean-up filter step is used to catch any oversize particles that may have been forced through in the last step. The same fine pore size filter paper used in the main filtering can be used in the clean up step. The filtering substantially excludes particles of diameter 3 $\mu$m and more, and practically limits particle diameter to about 2 $\mu$m. Herein, the "diameter of a particle" is the diameter of the smallest sphere which can enclose the particle.

Once the oversized particles are removed, the excess solvent is removed. The solvent boils at 200° C. However, at this temperature polymerization proceeds at a significant rate. At the very least, removing solvent by heat alone run the risk of greatly reducing the shelf life of the suspension. Polyamic acid is normally stored at about −20° C. for stability. During most of the procedures discussed herein, it can be safely warmed to about 0° C.

Referring to step 411, excess solvent can be removed with minimal polymerization by using vacuum distillation. Vacuum distillation under 10 mm mercury, e.g., 2-3 mm mercury, can proceed rapidly at 65° C.–66° C. As solvent vaporizes, it is quickly removed, since there is no other gaseous material to interfere with solvent evacuation. The vaporized solvent can be condensed and then captured in a graduated beaker to determine when all the solvent that was added to permit filtering is removed. At that point, distillation can be stopped. At this point the suspension is suitable for integrating into conventional semiconductor processing procedures. The by-weight composition of the precursor suspension is polyamic acid 12.66%, $TiO_2^-$ 5.08%, carbon black 1.27%, and solvent 80.00%. This material can be stored at −20° C. to maintain stability until it is to be used.

Referring to FIG. 4B, the precursor suspension can be applied to a wafer to provide shield 25. The application of the shield normally follows the fabrication of the active elements on the wafer, which may bear hundreds or thousands of integrated circuits, in accordance with procedures well known in the semiconductor processing art. Preferably, the active elements are fabricated, metallization is applied to function as contacts and leads, and a passivation layer is applied over everything.

After the precursor suspension is warmed to room temperature, in part to avoid condensation, it can be spun onto the passivated integrated circuit, as indicated at 413. Application of the precursor suspension is similar to the application of photo-resist. A glob is applied and the wafer is spun slowly until the suspension covers the wafer. Then spin speed is stepped to a greater rate so that the suspension flattens out and excess suspension leaves the wafer. The spinning speed is selected so that the final thickness is about 13–15 $\mu$m.

At step 415, the precursor suspension is baked at about 100° C. to remove the remaining solvent. The suspension is then hard to the touch and ready for patterning, if desired. At step 417, the photo-resist is spun onto the suspension covered wafer. At step 419, the photo-resist is patterned, e.g., masked, exposed and developed, according to conventional photo-lithographic techniques. At step 421, the shield material is etched with a mixture of about 70% by weight hydrazine, 20% by weight ethylenediamine and 10% by weight water. Etching continues until the surface of the wafer can be seen except where there is photo-resist. At step 423, the remaining photo-resist is stripped.

At step 425, the patterned shield material is cured so that the carrier material polymerizes to polyimide. For example, the wafer can be heated at 250° C. for ½ hour and then at 350° C. for another ½ hour. At this point the wafer can be sawed to yield integrated circuit 11, which is ready for packaging as desired. The shield material is opaque to infrared and visible light and serves as a protective barrier against contaminants.

The present invention provides for many variants of the preferred embodiments described above. Several alternatives to titanium dioxide are provided for the reflective particles. The relative concentrations of the carrier, reflective material and light-absorbing material can be varied extensively. In applications where conductivity is not a problem, higher concentrations of carbon black can be used. In applications where associated contamination is not a problem, magnetite or other light-absorbing material can be employed.

The light absorbing function need not be provided by particulate matter. For example, where only narrow band shielding is required, the carrier material itself can be selected to absorb the frequency range of interest. Alternatively, a light-absorbing material can be dissolved into the carrier.

For some applications, the final phase of the carrier can be fluid. The liquid suspension yielded at the end of the steps of FIG. 4A can serve as an optical shield. Even more so, the hardened precursor suspension existing after step 415 is adapted for preventing the passage of light. Where a rigid solid phase is required, this can be achieved through polymerization. However, a solid phase can be achieved in other ways, for example, by freezing a carrier fluid.

While integrated circuit 11 is selectively shielded, the shield material can be used to cover an integrated circuit completely so that all of its elements are protected from light and contamination. It is noted that semiconductor circuit packages can sometimes crack due to thermal expansion and contraction. In the event of such a crack, the integrated circuit covered with shield material would still be protected from light and contaminant leakage through the packaging.

Materials can be included in the suspension to provide additional properties. Different approaches to fabricating the suspension and to applying it to semiconductor wafers and other structures are within the ken of those skilled in the art. These and other modifications to and variation on the described embodiments are provided by the present invention, the scope of which is limited only by the following claims.

What is claimed is:

1. An integrated circuit structure comprising:
   an integrated circuit including a semiconductor substrate and plural circuit elements fabricated thereon;
   an insulating material disposed over at least one of said circuit elements, said material including nonconductive reflective particles and light-absorbing particles suspended in a carrier, said material being selected to absorb light over at least a predetermined frequency range.

2. The integrated circuit structure of claim 1 wherein said integrated circuit includes at least one photo-responsive element, said material being patterned to permit light access to photo-responsive element.

3. An integrated circuit structure comprising:
   an integrated circuit including a semiconductor substrate and plural circuit elements fabricated thereon, including at least one photo-responsive element;
   material disposed over at least one of said circuit elements, said material including reflective particles and light-absorbing carbon black particles suspended in a carrier and patterned to permit light access to said photo-responsive element, said material being selected to absorb light over at least a predetermined frequency range; and
   wherein at most a negligible proportion of particles suspended in said carrier having diameters greater than 3 $\mu$m, and said reflective particles are of titanium dioxide and have diameters between 0.1 $\mu$m and 2.0 $\mu$m.

4. The integrated circuit structure of claim 3 wherein the range of concentrations by weight of polyimide to titanium dioxide to carbon black is at least 50% polyimide, 20%-50% titanium dioxide and 2%-10% carbon black.

5. The integrated circuit structure of claim 2 wherein said material is formed by spinning a prepolymer-based suspension on said integrated circuit using thick-film techniques, photo-lithographically patterning said prepolymer suspension, and curing said prepolymer carrier.

6. The integrated circuit structure of claim 2 wherein said light-absorbing particles are electrically conductive.

7. The integrated circuit structure of claim 2 wherein said light-absorbing particles are carbon black.

8. The integrated circuit structure of claim 2 wherein a negligible proportion of particles suspended in said carrier have diameters greater than 3 $\mu$m.

9. The integrated circuit structure of claim 8 wherein said reflective particles have diameters between 0.1 $\mu$m and 2.0 $\mu$m.

10. An integrated circuit structure comprising:
an integrated circuit including a semiconductor substrate and plural circuit elements fabricated thereon including at least one photo-responsive element; and
material disposed over at least one of said circuit elements, said material including reflective titanium dioxide particles and light-absorbing particles suspended in a carrier and patterned to permit light access to said photo-responsive element, said material being selected to absorb light over at least a predetermined frequency range, and wherein a negligible proportion of particles suspended in said carrier having diameters greater than 3 $\mu$m, and said reflective particles have diameters between 0.1 $\mu$m and 2.0 $\mu$m.

11. A material comprising:
a carrier;
light-absorbing carbon black particles suspended in said carrier, at most a negligible proportion of said carbon black particles having diameters greater than 3.0 $\mu$m; and
nonconductive reflective particles having diameters between 0.1 $\mu$m and 2.0 $\mu$m suspended in said carrier.

12. The material of claim 11 wherein said carrier is a prepolymer.

13. The material of claim 11 wherein said carrier is polyimide.

14. A material comprising:
a polyimide carrier;
particles suspended in said carrier, at most a negligible proportion of said particles having diameters greater than 3.0 $\mu$m, said particles including reflective titanium dioxide particles and light-absorbing carbon black particles, said reflective particles having diameters between 0.1 $\mu$m and 2.0 $\mu$m.

15. The material of claim 14 wherein the range of concentrations by weight of polyimide to titanium dioxide to carbon black is at least 50% polyimide, 20%-50% titanium dioxide and 2%-10% carbon black.

* * * * *